(12) United States Patent
Cho et al.

(10) Patent No.: US 9,966,562 B2
(45) Date of Patent: May 8, 2018

(54) PHOTOCURABLE ADHESIVE FILM FOR ORGANIC ELECTRONIC DEVICE SEAL, ORGANIC ELECTRONIC DEVICE, AND METHOD FOR SEALING SAME

(71) Applicant: LG CHEM, LTD., Seoul (KR)

(72) Inventors: Yoon Gyung Cho, Daejeon (KR); Hyun Jee Yoo, Daejeon (KR); Jung Sup Shim, Daejeon (KR); Suk Ky Chang, Daejeon (KR)

(73) Assignee: LG Chem, Ltd., Seoul (KR)

( * ) Notice: Subject to any disclaimer, the term of this patent is extended or adjusted under 35 U.S.C. 154(b) by 81 days.

(21) Appl. No.: 14/263,677

(22) Filed: Apr. 28, 2014

(65) Prior Publication Data
US 2014/0319497 A1  Oct. 30, 2014

Related U.S. Application Data

(63) Continuation of application No. PCT/KR2012/009757, filed on Nov. 16, 2012.

(30) Foreign Application Priority Data

Nov. 18, 2011 (KR) .................. 10-2011-0121222
Nov. 16, 2012 (KR) .................. 10-2012-0130261

(51) Int. Cl.
*H01L 51/52* (2006.01)
*C09J 133/06* (2006.01)
(Continued)

(52) U.S. Cl.
CPC ........ *H01L 51/5253* (2013.01); *C08G 18/003* (2013.01); *C08G 18/6229* (2013.01);
(Continued)

(58) Field of Classification Search
CPC ...... C08G 18/6229; C09J 133/066; C09J 7/00
See application file for complete search history.

(56) References Cited

U.S. PATENT DOCUMENTS 6,291,704 B1 * 9/2001 Anderson ............... C07C 43/17
560/105
2006/0105483 A1 * 5/2006 Leatherdale ............ H01L 33/56
438/26

(Continued)

FOREIGN PATENT DOCUMENTS

CN    1170747 A    1/1998
CN    1662625 A    8/2005
(Continued)

OTHER PUBLICATIONS

Korean Office Action dated Feb. 11, 2014 for corresponding Korean Application No. 10-2012-0130261.

*Primary Examiner* — Victor S Chang
(74) *Attorney, Agent, or Firm* — Dentons US LLP

(57) ABSTRACT

Provided are a photocurable pressure-sensitive adhesive composition including an acrylic polymer, an epoxy resin, and a cationic photopolymerization initiator, an organic electronic device having an encapsulant including a photocured product of the composition using a curable pressure-sensitive adhesive film which is a film-state product including the composition, and a method for manufacturing an organic electronic device using the curable pressure-sensitive adhesive film. Particularly, due to the method including laminating a photocurable pressure-sensitive adhesive film including a curable pressure-sensitive adhesive layer including an acrylic polymer, an epoxy resin, and a cationic photopolymerization initiator to an top substrate, and radiating light to an entire surface of the curable pressure-sensitive adhesive layer to perform photocuring, and laminating the photocured curable pressure-sensitive adhesive (Continued)

layer to a bottom substrate on which an organic light emitting element is formed to cover an entire surface of the organic light emitting element, mechanical strength and a simple process caused by photocuring to the organic light emitting element without direct light irradiation may be achieved, and a lifespan of the element may be increased.

20 Claims, 1 Drawing Sheet

(51) Int. Cl.
| | | |
|---|---|---|
| C09J 133/12 | (2006.01) | |
| C09J 133/14 | (2006.01) | |
| C09J 163/00 | (2006.01) | |
| C09J 175/04 | (2006.01) | |
| C08G 18/62 | (2006.01) | |
| C08G 18/76 | (2006.01) | |
| C08G 18/00 | (2006.01) | |
| C09J 7/00 | (2018.01) | |
| C08G 59/68 | (2006.01) | |

(52) U.S. Cl.
CPC ......... *C08G 18/7642* (2013.01); *C08G 59/68* (2013.01); *C09J 7/00* (2013.01); *C09J 133/066* (2013.01); *C09J 133/12* (2013.01); *C09J 133/14* (2013.01); *C09J 163/00* (2013.01); *C09J 175/04* (2013.01); *H01L 51/5246* (2013.01); *C08G 2170/40* (2013.01); *C09J 2203/326* (2013.01); *C09J 2205/31* (2013.01); *C09J 2433/00* (2013.01); *C09J 2433/006* (2013.01); *C09J 2463/006* (2013.01); *H01L 51/5259* (2013.01)

(56) References Cited

U.S. PATENT DOCUMENTS

| | | |
|---|---|---|
| 2007/0170861 A1 | 7/2007 | Lee et al. |
| 2007/0218190 A1* | 9/2007 | Takashima .......... H01L 51/0002 427/66 |
| 2009/0066214 A1* | 3/2009 | Choi .................. H01L 51/5237 313/483 |
| 2010/0148666 A1* | 6/2010 | Liu ........................... C08F 2/46 313/512 |
| 2011/0242796 A1 | 10/2011 | Yang et al. |

FOREIGN PATENT DOCUMENTS

| | | |
|---|---|---|
| CN | 1678639 A | 10/2005 |
| JP | 2002-317172 A | 10/2002 |
| JP | 2006-037086 A | 2/2006 |
| JP | 2007-184279 A | 7/2007 |
| KR | 10-2005-0047436 A | 5/2005 |
| KR | 10-2006-0020381 A | 3/2006 |
| KR | 10-2010-0037042 A | 4/2010 |
| KR | 10-2010-0069205 A | 6/2010 |
| TW | 200905940 | 2/2009 |
| TW | 201114874 A1 | 5/2011 |
| WO | 2003/106582 A1 | 12/2003 |
| WO | 2011056026 A2 | 5/2011 |

* cited by examiner

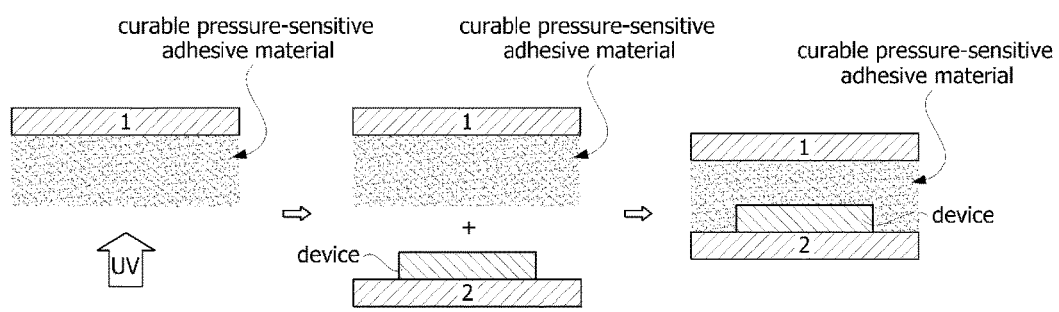

PHOTOCURABLE ADHESIVE FILM FOR ORGANIC ELECTRONIC DEVICE SEAL, ORGANIC ELECTRONIC DEVICE, AND METHOD FOR SEALING SAME

This application is a Continuation Bypass Application of International Patent Application No. PCT/KR2012/009757, filed on Nov. 16, 2012, and claims the benefit of Korean Patent Application Nos. 10-2011-0121222, filed on Nov. 18, 2011 and 10-2012-0130261, filed on Nov. 16, 2012, in the Korean Intellectual Property Office, all of which are incorporated by reference herein in their entirety.

BACKGROUND

1. Field of the Invention

The present invention relates to an organic electronic device, and particularly, to a photocurable pressure-sensitive adhesive composition used to encapsulate an organic electronic device (OED), an adhesive film formed thereof, and a method of manufacturing an OED.

2. Discussion of Related Art

An OED refers to a device including an organic material layer generating the exchange of charges using holes and electrons, and may include a photovoltaic device, a rectifier, a transmitter and an organic light emitting diode (OLED).

An OLED, which is a representative OED, has less power consumption and a higher response speed than conventional light sources, and is preferable as a thin display device or light source. In addition, the OLED has excellent space utilization, and thus is expected to be applied in various fields including all kinds of portable devices, monitors, notebook computers and TVs.

To extend compatibility and use of the OLED, the most important problem is durability. Organic materials and metal electrodes included in the OLED are very easily oxidized by external factors such as moisture, and a product including the OLED is very sensitive to environmental factors. Therefore, various methods of preventing penetration of oxygen or moisture from an external environment have been suggested.

A large-scale element has a limitation in an edge sealing method due to the deterioration of the element caused by the lack of mechanical strength and the decrease in efficiency of heat emission. Generally, a UV edge sealing or frit method in combination with a getter additionally uses a heat-curable/visible ray-curable filling adhesive, which thus makes a process complicated, resulting in a further increase in cost.

In addition, although the edge sealing may improve mechanical strength and ensure a moisture barrier property due to the type of filling, the edge sealing may be difficult to apply to a flexible display. The heat-curable entire surface filler is necessarily cured at low temperature to avoid damage to an element. However, since the heat-curable filler has a short pot life to be cured at low temperature, processability is degraded. The visible ray-curable filler has difficult curing conditions and many limitations in selection of a material, compared to a UV-curable filler.

In Korean Patent Application Publication No. 2009-0121271, an adhesive method using a liquid-state adhesive resin composition containing a heat-curable resin, a latent curing agent, a photopolymerizable resin component having an unsaturated group and a visible-ray polymerization initiator is disclosed. Since the liquid-state adhesive resin composition is pre-cured by visible-ray irradiation to an entire surface of a substrate including an element and then cured by heat, the organic light emitting element may be damaged.

SUMMARY OF THE INVENTION

The present invention is directed to providing an OED which may effectively encapsulate an organic light emitting element without direct light irradiation to the element, have a longer pot life after light irradiation and a simple process, and enhance the lifespan of the element, a method of manufacturing the same, a curable pressure-sensitive adhesive composition for encapsulating the same, and a curable pressure-sensitive adhesive film.

In one aspect, the present invention provides an OED including a substrate on which an organic light emitting element is formed, and a curable pressure-sensitive adhesive film encapsulating an entire surface of the organic light emitting element on the substrate.

The curable pressure-sensitive adhesive film includes a curable pressure-sensitive adhesive layer which is a semi-solid at room temperature and includes a photocured product of a photocurable pressure-sensitive adhesive composition including an acrylic polymer, an epoxy resin and a cationic photopolymerization initiator. The curable pressure-sensitive adhesive layer has a viscosity before light irradiation of $10^5$ to $10^7$ Pa·s and a viscosity after light irradiation of $10^6$ to $10^8$ Pa·s.

In another aspect, the present invention provides a method for manufacturing an OED, including laminating a photocurable pressure-sensitive adhesive film including a curable pressure-sensitive adhesive layer including an acrylic polymer, an epoxy resin and a cationic photopolymerization initiator to an top substrate and radiating light to an entire surface of the curable pressure-sensitive adhesive layer to perform photocuring; and laminating the photocured curable pressure-sensitive adhesive layer on a bottom substrate on which an organic light emitting element is formed to cover an entire surface of the organic light emitting element.

In still another aspect, the present invention provides an OED for a photocurable pressure-sensitive adhesive composition for encapsulating an OED including an acrylic polymer, an epoxy resin, and a cationic photopolymerization initiator.

In yet another aspect, the present invention provides a photocurable pressure-sensitive adhesive film for encapsulating an OED, which is a film-state product including the photocurable pressure-sensitive adhesive composition and includes a curable pressure-sensitive adhesive layer having a viscosity before light irradiation of $10^5$ to $10^7$ Pa·s and a viscosity after light irradiation of $10^6$ to $10^8$ Pa·s.

EFFECT

According to exemplary embodiments of the present invention, post-curing (heat-curing) is performed in a dark reaction without damage to the element by light since light is not directly radiated, and therefore it is possible to cure an entire surface of the adhesive film encapsulating the element. Moreover, since the heat-curing is followed after partial crosslinking performed by light irradiation, a desired moisture barrier property can be obtained by performing the heat-curing at a lower temperature and in a shorter time than a method using only heat-curing. In addition, since the ratio and kinds of the pressure-sensitive curable adhesive can be selected from a wide range, a degree of process freedom is high even after light irradiation. Due to encapsulation of an entire surface of an OED panel, a mechanical strength and a simple process by photocuring can be achieved, and thus a tack time can be minimized. In addition, since the curing is performed at a lower temperature than the method using only heat-curing, thermal transformation and contraction by curing occur less, and therefore flexibility generated in a large-scale element or between hetero materials can be reduced. Particularly, as an organic light emitting element is encapsulated with a semi-solid curable pressure-sensitive adhesive film at room temperature, the OED can be applied to a flexible display.

BRIEF DESCRIPTION OF THE DRAWINGS

FIG. 1 is a schematic diagram illustrating a process of manufacturing an OED according to an exemplary embodiment of the present invention.

DETAILED DESCRIPTION OF EXEMPLARY EMBODIMENTS

Exemplary embodiments of the present invention relate to an OED, and particularly, to a curable pressure-sensitive adhesive composition encapsulating an OED including an organic light emitting element and a curable pressure-sensitive adhesive film. The term "organic electronic device (OED)" used herein refers to a product or device having a structure including an organic material layer generating the exchange of charges between a pair of facing electrodes using holes and electrons. The OED may include a photovoltaic device, a rectifier, a transmitter and an OLED, but the present invention is not limited thereto. In one embodiment of the present invention, the OED may be an OLED.

An OED according to one embodiment of the present invention includes a substrate on which an organic light emitting element is formed, and an encapsulant which is a curable pressure-sensitive adhesive film encapsulating an entire surface of the organic light emitting element on the substrate. The encapsulant is semi-solid at room temperature, and includes a curable pressure-sensitive adhesive layer including a photocured product of a photocurable pressure-sensitive adhesive composition including an acrylic polymer, an epoxy resin and a cationic photopolymerization initiator.

Since the curable pressure-sensitive adhesive layer of the curable pressure-sensitive adhesive film has a viscosity before light irradiation of $10^5$ to $10^7$ Pa·s, it is easily adhered without bubbles in a process of laminating the curable pressure-sensitive adhesive film to an top substrate, such as roll-lamination. In addition, as the viscosity is increased to less than $10^6$ to $10^8$ Pa·s after light irradiation, the curable pressure-sensitive adhesive layer has a state suitable for thermal lamination with a bottom substrate, which is a substrate having an organic light emitting element.

In the OED, the curable pressure-sensitive adhesive layer is laminated to the top substrate and partially photocured by previous light irradiation, and then heat-cured by thermally laminating the photocured curable pressure-sensitive adhesive layer with the bottom substrate, which is the substrate having the organic light emitting element, unlike the conventional art in which the adhesive layer is formed on the bottom substrate, which is the substrate having the organic light emitting element, and then photocured. Therefore, the damage to an organic material expressing colors in the organic light emitting element may be prevented, thereby realizing an intrinsic color coordinate. Accordingly, problems arising in the conventional art in which the organic light emitting element is also irradiated with light to perform entire encapsulation, including the change in colors caused by the color coordinate change due to the damage to an organic material, a driving failure caused by the damage to an TFT element, etc. and a decrease in lifespan, may be solved Like the conventional art, when light irradiation is also performed on the organic light emitting element, the color coordinate is changed to 1% or more due to the damage to an organic material, or an emission lifespan of the organic light emitting element is decreased 5% or more. However, according to exemplary embodiments of the present invention, as the organic light emitting element is effectively encapsulated while avoiding light irradiation with respect to the organic light emitting element, these problems may be solved, and excellent adhesive performance may be provided.

The term "curable pressure-sensitive adhesive" used herein refers to a polymer material, which is a semi-solid at room temperature, exhibits pressure-sensitive adhesion and serves as an adhesive after post-curing.

The OED has a structure in which the entire surface of the organic light emitting element is encapsulated with the curable pressure-sensitive adhesive film described above. Here, the term "entire encapsulation" or "entire surface" refers to an entire area of an top portion of an organic light emitting element, that is, a surface of the organic light emitting element opposite to the surface thereof formed on a substrate of the OED, and also includes side surfaces thereof. The entire encapsulation refers to sealing with an encapsulant with no empty space between the organic light emitting element and the encapsulant. That is, the organic light emitting elements formed on the substrate are not spaced apart from the encapsulant but entirely sealed with the encapsulant formed of a curable pressure-sensitive adhesive composition with no empty space. Such an encapsulated structure is called face sealing. Even when at least one organic light emitting element is formed on the substrate, according to exemplary embodiments of the present invention, the organic light emitting elements may be encapsulated with no step difference. The entire encapsulation only means that there is no empty space between the organic light emitting element and the encapsulant. Therefore, an additional component such as a protective layer may be included between the organic light emitting element and the encapsulant.

In the OED according to the exemplary embodiments of the present invention, the curable pressure-sensitive adhesive film encapsulating the entire surface of the organic light emitting element includes a curable pressure-sensitive adhesive layer including a photocured product of a photocurable pressure-sensitive adhesive composition including an acrylic polymer, an epoxy resin and a cationic photopolymerization initiator.

The curable pressure-sensitive adhesive film may be semi-solid at room temperature and have a viscosity of $10^5$ to $10^7$ Pa·s. The term "room temperature" refers to a temperature in a natural environment, not increased or decreased. Room temperature may be approximately 15 to 35° C., specifically, approximately 20 to 25° C., and more specifically, approximately 25° C. The viscosity may be measured using an advanced rheometric expansion system (ARES). As the viscosity of the curable pressure-sensitive adhesive composition is controlled within the above range, no burrs or cracks are generated during punching, and thereby the film is easily handleable, has good work processability during the encapsulation of the OED, and can encapsulate the planar film at a uniform thickness. In addition, the problems of contraction and generation of a volatile gas occurring when the resin is cured may be considerably reduced, thereby preventing physical or chemical damage to the OED.

In addition, when the curable pressure-sensitive adhesive film is applied to the OED, it may have a water vapor transmission rate (WVTR) of less than 200 or 150 g/m$^2$·day in a state in which both photocuring by light irradiation and heat-curing by aging are completed. After the light irradiation such as UV irradiation, the WVTR may be decreased, and after the heat-curing, the WVTR may be further decreased.

The curable pressure-sensitive adhesive layer of the curable pressure-sensitive adhesive film may include a non-reacted product of the photocurable pressure-sensitive adhesive composition, for example, an acrylic polymer, an epoxy resin or a cationic photopolymerization initiator at less than 100 ppm after the light irradiation and heat-curing are sequentially performed.

In addition, when an entire encapsulated OED according to exemplary embodiments of the present invention is a top-emission type OED, the curable pressure-sensitive adhesive layer of the curable pressure-sensitive adhesive film may have a light transmittance in a visible ray region (380 to 780 nm) of 90%, 95% or 98% or more, and a haze of less than 2%, 1%, or 0.5%.

The acrylic polymer may have a glass transition temperature of −60 to −10° C., or −30 to −10° C. When the glass transition temperature of the acrylic polymer is less than −60° C., problems such as a moisture barrier property and durability against high temperature and high humidity may be generated, and when the glass transition temperature of the acrylic polymer is more than −10° C., problems with a laminating property and an adhesive property may be generated.

The acrylic polymer may have a weight average molecular weight of 50,000 to 2,000,000 or 100,000 to 1,000,000. Within the above range, a pressure-sensitive adhesive balanced in adhesive strength, durability against high temperature and high humidity and processability may be provided.

The acrylic polymer may include a crosslinkable functional group, and include comprises an alkyl(meth)acrylate and a copolymerizable monomer having a crosslinkable functional group in a polymerized form.

The alkyl(meth)acrylate may be an alkyl(meth)acrylate including an alkyl group having 1 to 14 carbon atoms in consideration of physical properties such as a cohesive strength, a glass transition temperature and a pressure-sensitive adhesive property. Such an alkyl(meth)acrylate may be one or at least two of methyl(meth)acrylate, ethyl(meth)acrylate, n-propyl(meth)acrylate, isopropyl(meth)acrylate, butyl(meth)acrylate, t-butyl(meth)acrylate, pentyl(meth)acrylate, 2-ethylhexyl(meth)acrylate, n-octyl(meth)acrylate, isooctyl(meth)acrylate, isononyl(meth)acrylate, isobornyl(meth)acrylate, methylethyl(meth)acrylate, lauryl(meth)acrylate and tetradecyl(meth)acrylate in a polymerized form.

The copolymerizable monomer having a crosslinkable functional group may provide a crosslinkable functional group capable of being reacted with a multifunctional crosslinking agent to the acrylic polymer. The crosslinkable functional group may be a glycidyl group, an isocyanate group, a hydroxyl group, a carboxyl group, an amide group, an epoxide group, a cyclic ether group, a sulfide group, an acetal group, a lactone group or a nitrogen-containing group.

In the field of preparing an acrylic polymer, various copolymerizable monomers capable of providing such a crosslinkable functional group to an acrylic polymer are known, and the above-described monomers may be used without limitation. For example, a copolymerizable monomer having a hydroxyl group may be 2-hydroxyethyl(meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 2-hydroxyethyleneglycol(meth)acrylate or 2-hydroxypropyleneglycol(meth)acrylate, a copolymerizable monomer having a carboxyl group may be (meth)acrylic acid, 2-(meth)acryloyloxy acetic acid, 3-(meth)acryloyloxypropionate, 4-(meth)acryloyloxy butyric acid, acrylic acid dimer, itaconic acid, maleic acid or maleic anhydride, and a copolymerizable monomer having a nitrogen-containing group may be (meth)acrylamide, N-vinyl pyrrolidone or N-vinyl caprolactame, but the present invention is not limited thereto.

In one example, the acrylic polymer may include 80 to 99.9 parts by weight of an alkyl(meth)acrylate, and 0.1 to 20 parts by weight of a copolymerizable monomer providing a crosslinkable functional group as polymerized units. The term "parts by weight" used herein refers to a weight ratio. As the weight ratio between monomers is controlled as described above, physical properties such as initial adhesive strength, durability and peel strength of the curable pressure-sensitive adhesive layer may be effectively maintained.

The acrylic polymer may be prepared by a conventional polymerization method known in the art, for example, solution polymerization, photo polymerization, bulk polymerization, suspension polymerization or emulsion polymerization.

The curable pressure-sensitive adhesive composition encapsulating the OED according to exemplary embodiments of the present invention includes an epoxy resin having a functional group capable of serving as a crosslinking agent by a reaction with a crosslinkable functional group included in the above-described acrylic polymer as well as the polymer.

The term "epoxy resin" used herein refers to a resin having at least one epoxy group in a molecule. Here, the epoxy group may be an epoxy group binding to a cycloaliphatic ring, that is, a cycloaliphatic epoxy group. In this case, a hydrogen atom constituting the cycloaliphatic ring may be optionally substituted with a substituent such as an alkyl group.

The epoxy resin may be at least one selected from the group consisting of a multifunctional epoxy resin, bisphenol-based epoxy resins (a bisphenol A-type epoxy resin, a bisphenol F-type epoxy resin and a bisphenol AD-type epoxy resin), a novolac-type epoxy resin, a naphthalene-type epoxy resin, a trisphenolmethane-type epoxy resin, a glycidyl amine-type epoxy resin and a cycloaliphatic epoxy resin. When the multifunctional epoxy resin is used, a crosslinking density may be increased, and thus a moisture barrier property may be enhanced.

The curable pressure-sensitive adhesive composition may include the above-described epoxy resin at 1 to 30 or 5 to 20 parts by weight relative to 100 parts by weight of the acrylic polymer. When the weight ratio of the epoxy compound is excessively low, a peel strength of a curable pressure-sensitive adhesive may be decreased, and when the weight ratio of the epoxy compound is excessively high, processability and coatability of the composition may be degraded. Therefore, in consideration of these factors, a suitable content may be controlled.

The curable pressure-sensitive adhesive composition includes a photopolymerization initiator. The photopolymerization initiator may be, but is not particularly limited to, a cationic photopolymerization initiator. The term "cationic photopolymerization initiator" used herein refers to a compound capable of initiating cationic polymerization by light irradiation or a compound capable of producing a compound capable of initiating cationic polymerization by light irradiation.

The kind of cationic photopolymerization initiator is not particularly limited, and thus a known cationic photopolymerization initiator such as an aromatic diazonium salt, an aromatic iodine aluminum salt, an aromatic sulfonium salt or an iron-arene complex, and preferably, an aromatic sulfonium salt may be used. However, the present invention is not limited thereto.

The cationic photopolymerization initiator may be included at 0.01 to 10 or 1 to 5 parts by weight relative to 100 parts by weight of the acrylic polymer. When the content of the cationic photopolymerization initiator is excessively low, curing may not be sufficiently performed, and when the content of the photopolymerization initiator is excessively high, the content of the ionic material is increased after curing, thereby increasing an absorbing property of the curable outgassing. Therefore, a suitable range of the content may be selected consideration of these.

The curable pressure-sensitive adhesive composition may further include a crosslinking agent to have a laminating property when crosslinking by the epoxy resin does not sufficiently occur.

The kind of crosslinking agent may be, though not particularly limited, selected depending on the kind of crosslinkable functional group included in the polymer. For example, known crosslinking agents such as an isocyanate-based compound, an epoxy-based compound, an aziridine-based compound and a metal chelate-based compound may be used. In this case, the isocyanate-based compound may be tolylene diisocyanate, xylene diisocyanate, diphenylmethane diisocyanate, hexamethylene diisocyanate, isoboron diisocyanate, tetramethylxylene diisocyanate or naphthalene diisocyanate, and in some cases, a reaction product of at least one of the isocyanate compounds described above and a polyol (e.g., trimethylol propane) may be used. In addition, the epoxy-based compound may be at least one selected from the group consisting of ethyleneglycol diglycidylether, triglycidylether, trimethylolpropane triglycidylether, N,N,N',N'-tetraglycidyl ethylenediamine and glycerine diglycidylether, the aziridine-based compound may be at least one selected from the group consisting of N,N'-toluene-2,4-bis(1-aziridinecarboxide), N,N'-diphenylmethane-4,4'-bis(1-aziridinecarboxide), triethylene melamine, bisisoprotaloyl-1-(2-methylaziridine) and tri-1-aziridinylphosphineoxide, and the metal chelate-based compound may be a compound in which a polyvalent metal such as aluminum, iron, zinc, tin, titanium, antimony, magnesium and/or vanadium is coordinated with acetyl acetone or ethyl aceto acetate.

The curable pressure-sensitive adhesive composition may include the crosslinking agent at 0.01 to 10 or 0.1 to 5 parts by weight relative to 100 parts by weight of the acrylic polymer. Accordingly, cohesive strength of a cured product of the composition may be maintained at a suitable level, and a pot life may also be effectively controlled.

In the OED according to exemplary embodiments of the present invention, to secure a high moisture barrier property of the encapsulant, the curable pressure-sensitive adhesive composition may further include a moisture adsorbent. The term "moisture adsorbent" may include components capable of adsorbing or removing moisture or vapor input from the outside by a chemical reaction with moisture, and is also called a moisture-reactive adsorbent.

A specific kind of moisture adsorbent capable of being used in exemplary embodiments of the present invention is not particularly limited, and may include one or a mixture of at least two of metal powder such as alumina, a metal oxide, an organic metal oxide, a metal salt and phosphorus pentoxide ($P_2O_5$).

A specific kind of metal oxide may be lithium oxide ($Li_2O$), sodium oxide ($Na_2O$), barium oxide (BaO), calcium oxide (CaO) or magnesium oxide (MgO), the metal salt may be a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$) or nickel sulfate ($NiSO_4$); a metal halide such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$) or magnesium iodide ($MgI_2$); or a metal chlorate such as barium perchlorate ($Ba(ClO_4)_2$) or magnesium perchlorate ($Mg(ClO_4)_2$), but the present invention is not limited thereto.

The metal oxides may be mixed with the composition in a state in which the moisture adsorbent is suitably processed. For example, depending on the kind of OED to which the curable pressure-sensitive adhesive film is to be applied, the curable pressure-sensitive adhesive layer may be a thin film having a thickness of 30 μm or less, and in this case, it may be necessary to perform a grinding process on the moisture adsorbent. To grind the moisture adsorbent, a process such as 3-roll milling, bead milling or ball milling may be used. In addition, when the moisture adsorbent is applied to the top-emission type OED, transmittance of the curable pressure-sensitive adhesive layer is very important, and thus it is necessary to decrease the size of the moisture adsorbent. Therefore, to be used in such a use, the moisture adsorbent is necessarily subjected to a grinding process.

The curable pressure-sensitive adhesive composition may include the above-described moisture adsorbent at 5 to 50 or 10 to 30 parts by weight relative to 100 parts by weight of the acrylic polymer.

The curable pressure-sensitive adhesive composition may include a filler, for example, an inorganic filler. The filler may inhibit penetration of moisture or vapor into an encapsulated structure by extending a traveling route of the moisture or vapor, and maximize a barrier property against moisture and vapor through a matrix structure of a resin and an interaction with the moisture adsorbent. A specific kind of filler capable of being used in exemplary embodiments of the present invention is not particularly limited, and may be one or a mixture of at least one or more of clay, talc, silica, barium sulfate, aluminum hydroxide, calcium carbonate, magnesium carbonate, zeolite, zirconia, titania or montmorillonite.

In addition, to increase a binding efficiency between the filler and the resin, a product whose surface is treated with an organic material may be used as the filler, or a coupling agent may be further added to the filler.

The curable pressure-sensitive adhesive composition may include 1 to 100 or 5 to 30 parts by weight of the filler relative to 100 parts by weight of the acrylic polymer. As the content of the filler is controlled to 1 part by weight or more, a cured product having excellent moisture or vapor barrier properties and mechanical properties may be provided. In addition, as the content of the filler is controlled to 100 parts by weight or less, a cured product capable of being formed in a film, and exhibiting pressure-sensitive adhesive characteristics even when formed in a thin film may be provided.

The curable pressure-sensitive adhesive composition may further include one or at least one or more of additives such as a UV stabilizer, an antioxidant, a coloring agent, a reinforcing agent, a filler, a foaming agent, a surfactant, a photothickening agent and a plasticizer, in addition to the above-described components, without influencing the effects of the present invention.

As described above, the curable pressure-sensitive adhesive composition used as the encapsulant is applied as the encapsulant of the OED after being formed into a separate curable pressure-sensitive adhesive film, which enables structural adhesion between the substrate and the top substrate. Therefore, a manufacturing process is simple during the manufacture of an OED panel, and a decrease in encapsulation thickness of the OED may contribute to manufacturing a thinner OED.

A photocurable pressure-sensitive adhesive film according to exemplary embodiments of the present invention is a film-state product including the photocurable pressure-sensitive adhesive composition for an OED including the acrylic polymer, epoxy resin and cationic photopolymerization initiator, and includes a curable pressure-sensitive adhesive layer having a viscosity of $10^5$ to $10^7$ Pa·s before light irradiation and a viscosity of $10^6$ to $10^8$ Pa·s after light irradiation.

The curable pressure-sensitive adhesive layer of the curable pressure-sensitive adhesive film may be a single-layered structure, or a multi-layered structure having at least two layers. When the curable pressure-sensitive adhesive film includes a multi-layered curable pressure-sensitive adhesive layer, the moisture adsorbent may be contained more in a layer disposed far away from the organic light emitting element.

The structure of the curable pressure-sensitive adhesive film is not particularly limited as long as the film includes the curable pressure-sensitive adhesive layer. For example, the curable pressure-sensitive adhesive film may have a structure including a base or release film (hereinafter referred to as a "first film"); and the curable pressure-sensitive adhesive layer containing the composition, which is formed on the base or release film. The adhesive film may further include another base or release film (hereinafter referred to as a "second film"), which is formed on the curable pressure-sensitive adhesive layer.

A specific kind of the first film capable of being used in exemplary embodiments of the present invention is not particularly limited. As the first film, a polymer film generally used in the art may be used. For example, as the base or release film, a polyethyleneterephthalate film, a polytetrafluoroethylene film, a polyethylene film, a polypropylene film, a polybutene film, a polybutadiene film, a vinylchloride copolymer film, a polyurethane film, ethylene-vinylacetate film, an ethylene-propylene copolymer film, an ethylene-acrylic acid ethyl copolymer film, an ethylene-acrylic acid methyl copolymer film or a polyimide film may be used. In addition, suitable releasing treatment may be performed on one or both surfaces of the base or release film. As a releasing agent used in releasing treatment of the base film, an alkyd-based, silicon-based, fluorine-based, unsaturated ester-based, polyolefin-based or wax-based releasing agent, and preferably, for thermal resistance, an alkyd-based, silicon-based or fluorine-based releasing agent may be used, but the present invention is not limited thereto.

In addition, a kind of the second film (hereinafter, also referred to as a "cover film") capable of being used in exemplary embodiments of the present invention is not particularly limited either. For example, the second film may be the same as or different from the first film within the range exemplified as the first film. In addition, the second film may also be subjected to suitable releasing treatment.

A thickness of the base or release film (first film) is not particularly limited, and may be suitably selected according to its use. For example, the first film may have a thickness of 10 to 500 μm or 20 to 200 μm. When the thickness of the film is controlled in the above range, transformation of the base film may be prevented and economic feasibility may be increased.

A thickness of the second film is not particularly limited either. For example, the thickness of the second film may be set the same as that of the first film. Alternatively, in consideration of processability, the thickness of the second film may be set relatively smaller than that of the first film.

A thickness of the curable pressure-sensitive adhesive layer included in the curable pressure-sensitive adhesive film is not particularly limited, and may be suitably selected in consideration of the use of the film.

The thickness of the curable pressure-sensitive adhesive layer included in the curable pressure-sensitive adhesive film may be 5 to 200 μm or 10 to 100 μm. When the thickness of the curable pressure-sensitive adhesive layer is less than 5 μm, embeddability and processability may be degraded when the curable pressure-sensitive adhesive film is used as an encapsulant of the OED, and when the thickness of the curable pressure-sensitive adhesive layer is more than 200 μm, economic feasibility is degraded.

A method of forming the curable pressure-sensitive adhesive film is not particularly limited. For example, the curable pressure-sensitive adhesive film may be formed by a method including a coating solution including the composition for a curable pressure-sensitive adhesive layer on a base or release film (first operation), and drying the coating solution coated in the first operation (second operation). The method of forming the curable pressure-sensitive adhesive film may further include additionally compressing a base or release film on the coating solution dried in the second operation (third operation).

The first operation is to prepare a coating solution by dissolving or dispersing the composition for a curable pressure-sensitive adhesive layer in a suitable solvent. A kind of solvent used in the preparation of a coating solution is not particularly limited. However, since drying time of the solvent is excessively long, or the solvent is necessarily dried at high temperature, problems may arise in terms of workability or durability of the curable pressure-sensitive adhesive film. For this reason, a solvent having a volatilization temperature of 100° C. or less may be used. Moreover, in consideration of film moldability, a small amount of solvent having a volatilization temperature in or beyond the above range may be mixed. The solvent may be, but is not limited to, one or a mixture of at least one or more of methylethylketone (MEK), acetone, toluene, dimethylformamide (DMF), methylcellosolve (MCS), tetrahydrofuran (THF) and N-methylpyrollidone (NMP).

In the first operation, a method of the coating solution on a base or release film is not particularly limited, and a known method such as knife coating, roll coating, spray coating, gravure coating, curtain coating, comma coating or lip coating may be used without limitation.

The second operation is to form a curable pressure-sensitive adhesive layer by drying the coating solution coated in the first operation. That is, in the second operation, a curable pressure-sensitive adhesive layer may be formed by drying and removing a solvent by heating the coating solution coated on the film. Here, a drying condition is not particularly limited, and the drying may be performed at 70 to 200° C. for 1 to 10 minutes.

In the forming method, following the second operation, the third operation of compressing an additional base or release film on the curable pressure-sensitive adhesive layer formed on the film, may be further performed. In the third operation, the additional release or base film (cover film or second film) may be compressed on the dried curable pressure-sensitive adhesive layer coated on the film by a hot-roll lamination or pressing process. Here, the third operation may be performed by hot-roll lamination in terms of possibility and efficiency of a continuous process, and the process may be performed at a temperature of approximately 10 to 100° C. and a pressure of approximately 0.1 to 10 kgf/cm$^2$.

In another exemplary embodiment of the present invention, a protective layer for protecting the organic light emitting element may be further included between an encapsulant and the organic light emitting element using the curable pressure-sensitive adhesive film.

The OED may further include an encapsulation substrate (top substrate) on the encapsulant, and the curable pressure-sensitive adhesive film serves to adhere the encapsulation substrate (top substrate) to the substrate (bottom substrate).

In still another exemplary embodiment of the present invention, the present invention provides a method for manufacturing an OED including laminating a photocurable pressure-sensitive adhesive film including a curable pressure-sensitive adhesive layer including an acrylic polymer, an epoxy resin, and a cationic photopolymerization initiator to an top substrate, and photocuring the curable pressure-sensitive adhesive layer by radiating light to an entire surface thereof; and laminating the photocured curable pressure-sensitive adhesive layer to a substrate (bottom substrate) on which an organic light emitting element is formed to cover an entire surface of the organic light emitting element.

Hereinafter, the method of manufacturing an OED will be described with reference to the accompanying drawings. FIG. 1 is a schematic diagram illustrating a process of manufacturing an OED according to an aspect of the present invention.

To manufacture an OED according to exemplary embodiments of the present invention, first, the curable pressure-sensitive adhesive film is laminated to the top substrate (encapsulation substrate), and light is radiated to the entire surface of the curable pressure-sensitive adhesive layer to perform photocuring. As the top substrate (encapsulation substrate), glass or a polymer substrate may be used, but the present invention is not limited thereto.

Subsequently, the photocured curable pressure-sensitive adhesive layer is laminated to the substrate (bottom substrate) on which the organic light emitting element is formed to cover the entire surface of the organic light emitting element.

A transparent electrode is formed on the glass or polymer film used as the substrate (bottom substrate) by vacuum deposition or sputtering, and a hole transport layer and an organic light emitting element (e.g., OLED) are formed on the transparent electrode. Subsequently, an electrode layer is further formed on the organic light emitting element. Afterward, the photocured curable pressure-sensitive adhesive layer (encapsulant) is laminated to the substrate (bottom substrate) having been subjected to the above process to cover the entire surface of the organic light emitting element. The laminating method may be selected from a laminating method in which heat and pressure are applied in a vacuum, a roll-laminating method in which only heat is applied, and a method using an autoclave.

Subsequently, following the lamination of the bottom substrate and the curable pressure-sensitive adhesive layer, to enhance an adhesive strength and a moisture barrier property, a low-temperature heat-curing (aging) process may be further performed. The aging process may be performed at 40 to 80° C. for 30 minutes to 3 hours.

In the method of manufacturing an OED according to exemplary embodiments of the present invention, the curable pressure-sensitive adhesive film formed using a curable pressure-sensitive adhesive composition is attached to an top substrate, that is, the encapsulating substrate not having an organic light emitting element, and light is radiated thereto. Subsequently, the bottom substrate having an organic light emitting element is laminated with the top substrate, and then post-curing is performed by a dark reaction. Therefore, entire curing is possible to perform without damage to the elements by light.

Hereinafter, the present invention will be described in further detail with reference to Examples according to the present invention and Comparative Examples not according to the present invention, but the scope of the present invention is not limited to the following Examples.

Example 1: Preparation of Curable Pressure-Sensitive Adhesive Film and OED

An acrylic polymer having a glass transition temperature of approximately −20° C. and a weight average molecular weight of 500,000 was prepared by polymerizing a pressure-sensitive adhesive containing 15 parts by weight of butyl acrylate, 40 parts by weight of methylethylacrylate, 20 parts by weight of isobornylacrylate, 15 parts by weight of methyl acrylate, and 10 parts by weight of hydroxyethylacrylate.

A coating solution was prepared to have a solid content of 20% by adding 0.2 parts by weight of an isocyanate-based crosslinking agent (xylene diisocyanate, T-39M), 5 parts by weight of a trimethylolpropane-type epoxy resin (SR-TMP, SAKAMOTO), 0.25 parts by weight of a triarylsulfonium salt-type cationic photopolymerization initiator (CPI-110A, SAN-APRO Ltd.), relative to 100 parts by weight of the acrylic polymer to the acrylic polymer, and adding ethyl acetate as a solvent.

A curable pressure-sensitive adhesive film (having a viscosity at 25° C. of approximately $10^6$ Pa·s) including a curable pressure-sensitive adhesive layer having a thickness of 40 μm was prepared by coating a 50 μm release PET film with the coating solution, drying the coated film in an oven at 100° C. for 10 minutes, and covering the dried film with a 25 μm release PET film.

After one of the release PET films was removed from the curable pressure-sensitive adhesive film, and the curable pressure-sensitive adhesive film was first laminated to a glass (top substrate) for encapsulation, as shown in FIG. 1, photocuring was performed by radiating a UV ray having an intensity of 10 J/cm$^2$ to a side surface of the curable pressure-sensitive adhesive film, the underlying release PET film was removed, the top substrate and the bottom substrate having an OLED were laminated by applying heat of 70° C.

and pressure of approximately 2 kgf in a vacuum of less than 100 mTorr using a vacuum laminator, and then aged (post-cured) at 80° C. for 3 hours.

Comparative Example 1

All the process was performed as described in Example 1, except that a coating solution was prepared without an isocyanate crosslinking agent.

Comparative Example 2

All the process was performed as described in Example 1, except that 5 parts by weight of YD-128 (Kukdo chemical) was used as an epoxy resin.

Comparative Example 3

All the process was performed as described in Example 1, except that the acrylic polymer used in Example 1 was used alone without an isocyanate-based crosslinking agent, a trimethylolpropane-type epoxy resin and a triarylsulfonium salt-type cationic photopolymerization initiator.

Comparative Example 4

All the process was performed as described in Example 1, except that 40 parts by weight of the trimethylolpropane-type epoxy resin (SR-TMP, SAKAMOTO) used in Example 1 was used.

Experimental Example 1: Measurement of Viscosity

Viscosities of the curable pressure-sensitive adhesive layers of the adhesive films according to Example 1 and Comparative Examples 1 to 4 before and after light irradiation were measured by ARES, and the results are listed in Table 1.

TABLE 1

|  | Viscosity before light irradiation (Pa · s, 25° C.) | Viscosity after light irradiation (Pa · s, 25° C.) |
| --- | --- | --- |
| Example 1 | $4.1 \times 10^5$ | $1.2 \times 10^6$ |
| Comparative Example 1 | $3.9 \times 10^5$ | $9.8 \times 10^5$ |
| Comparative Example 2 | $4.2 \times 10^5$ | $7.1 \times 10^5$ |
| Comparative Example 3 | $4.3 \times 10^5$ | $4.3 \times 10^5$ |
| Comparative Example 4 | $3.7 \times 10^5$ | $2.5 \times 10^6$ |

Experimental Example 2: Evaluation of WVTR

After the curable pressure-sensitive adhesive films prepared in Example 1 and Comparative Examples 1 to 4 were heat-cured, WVTRs with respect to an area of 1 cm² were measured using the PERMATRAN-W Model 3/61 produced by MOCON under conditions of a temperature of 37.8° C. and relative humidity of 100%. The results are listed in Table 2.

Experimental Example 3: Measurement of Transmittance and Haze

The curable pressure-sensitive adhesive films prepared in Example 1 and Comparative Examples 1 to 4 were subjected to measurement of transmittance and haze using a haze meter HR-100 (Murakami Color Research Laboratory), and the measurement results are listed in Table 2.

Experimental Example 4: Evaluation of Adhesive Strength

After the curable pressure-sensitive adhesive films prepared in Example 1 and Comparative Examples 1 to 4 were cut to a size of 25 mm×100 mm, laminated to a glass and then cured, the film was measured in peel strength when peeled off at an angle of 180°. A pulling speed was 300 mm/min, and then an average was obtained after the peel strength was measured twice per sample. The results are listed in Table 2.

TABLE 2

|  | WVTR (g/m² · 24 h, 100 μm base) | Transmittance (%) | Haze (%) | Adhesive strength (gf/25 mm) |
| --- | --- | --- | --- | --- |
| Example 1 | 102 | More than 98 | Less than 1 | 454 |
| Comparative Example 1 | 109 | More than 98 | Less than 1 | 496 |
| Comparative Example 2 | 116 | More than 98 | Less than 1 | 477 |
| Comparative Example 3 | Impossible to measure (500<) | More than 98 | Less than 1 | 875 |
| Comparative Example 4 | 90 | More than 98 | Less than 1 | 102 |

Comparative Example 5

All the process was performed as described in Example 1, except that one release PET film was removed from the curable pressure-sensitive adhesive film prepared in Example 1, the film was laminated to a glass (top substrate) for encapsulation, the other release PET film was also removed, a bottom substrate having an OLED was laminated with the top substrate by applying heat of 70° C. and pressure of approximately 2 kgf in a vacuum of less than 100 mTorr using a vacuum laminator before light irradiation, and then a UV ray having an intensity of 10 J/cm² was radiated.

Experimental Example 5: Confirmation of Damage to Element

Comparing color coordinates of an organic light emitting element between the OEDs formed in Example 1 and Comparative Example 5, it could be confirmed that the color coordinate of the organic light emitting element in Comparative Example 5 was changed 5% or more, compared to that of Example 1, and a lifespan, under high temperature and high humidity in Comparative Example 5, was decreased 10% or more, compared to those in Example 1.

Example 2

All the process was performed as described in Example 1, except that a metal oxide (BaO) was further added to the coating solution as a moisture adsorbent at 10 parts by weight relative to 100 parts by weight of the acrylic polymer.

According to a indirect method such as a Ca test for confirming a moisture barrier property, it was confirmed that a lifespan was increased at least 5 times, compared to Example 1 not using a moisture adsorbent under conditions of a temperature of 85° C., 85% R. H. and a bezel of 5 mm.

As described above, an OED encapsulated using a curable pressure-sensitive adhesive film has an excellent moisture barrier property and adhesive strength, thereby effectively encapsulating the OED from moisture. It can be also confirmed that the OED has suitable light transmittance and haze as a top-emission type device, and thus the OED may be effectively encapsulated from moisture.

While the invention has been shown and described with reference to certain exemplary embodiments thereof, it will be understood by those skilled in the art that various changes in form and details may be made therein without departing from the scope of the invention as defined by the appended claims.

What is claimed is:

1. An organic electronic device, comprising:
a substrate on which an organic light emitting element is formed; and
a cured pressure-sensitive adhesive film encapsulating an entire surface of the organic light emitting element on the substrate,
wherein the cured pressure-sensitive adhesive film comprises a cured pressure-sensitive adhesive layer comprising a photocured-product of a photocurable pressure-sensitive adhesive composition comprising an acrylic polymer, an epoxy resin in an amount of 1 to 30 parts by weight relative to 100 parts by weight of the acrylic polymer, and a cationic photopolymerization initiator,
wherein the pressure-sensitive adhesive has a viscosity before light irradiation of $10^5$ to $10^7$ Pa·s and a viscosity after light irradiation of $10^6$ to $10^8$ Pa·s,
wherein the viscosity of the pressure-sensitive adhesive after light irradiation is higher than the viscosity of the pressure-sensitive adhesive before light irradiation,
wherein the cured pressure-sensitive adhesive film is a film which is partially photocured and then fully heat-cured, and
wherein the organic light emitting element is not irradiated during photocuring.

2. The device of claim 1,
wherein the cured pressure-sensitive adhesive film has a water vapor transmission rate of less than 150 g/m²·day after photo-curing and heat-curing.

3. The device of claim 1,
wherein the cured pressure-sensitive adhesive layer of the cured pressure-sensitive adhesive film comprises a non-reacted component of a photocurable pressure-sensitive adhesive composition at less than 100 ppm after light irradiation and heat-curing are sequentially performed.

4. The device of claim 1,
wherein the acrylic polymer has a glass transition temperature of −60 to −10° C., and a weight average molecular weight of 50,000 to 2,000,000.

5. The device of claim 1,
wherein the acrylic polymer comprises a crosslinkable functional group, and comprises an alkyl (meth)acrylate and a copolymerizable monomer having a crosslinkable functional group in a polymerized form.

6. The device of claim 5,
wherein the crosslinkable functional group is at least one or more selected from a glycidyl group, an isocyanate group, a hydroxyl group, a carboxyl group, an amide group, an epoxide group, a cyclic ether group, a sulfide group, an acetal group and a lactone group.

7. The device of claim 1,
wherein the epoxy resin is at least one or more selected from the group consisting of a multifunctional epoxy resin, a bisphenol-based epoxy resin, a novolac-type epoxy resin, a naphthalene-type epoxy resin, a trisphenolmethane-type epoxy resin, a glycidyl amine-type epoxy resin and a cycloaliphatic epoxy resin.

8. The device of claim 1,
wherein the cationic photopolymerization initiator is an aromatic diazonium salt, an aromatic iodine aluminum salt, an aromatic sulfonium salt or an iron-arene complex.

9. The device of claim 1,
wherein the photocurable pressure-sensitive adhesive composition comprises the cationic photopolymerization initiator in an amount of 0.01 to 10 parts by weight, relative to 100 parts by weight of the acrylic polymer.

10. The device of claim 1,
wherein the photocurable pressure-sensitive adhesive composition further comprises a crosslinking agent.

11. The device of claim 10,
wherein the crosslinking agent is an isocyanate-based compound, an epoxy-based compound, an aziridine-based compound or a metal chelate-based compound.

12. The device of claim 10,
wherein the photocurable pressure-sensitive adhesive composition comprises the crosslinking agent in an amount of 0.01 to 10 parts by weight, relative to 100 parts by weight of the acrylic polymer.

13. The device of claim 1,
wherein the photocurable pressure-sensitive adhesive composition further comprises a moisture adsorbent.

14. The device of claim 13,
wherein the moisture adsorbent is alumina, a metal oxide, an organic metal oxide, a metal salt or phosphorus pentoxide.

15. The device of claim 14,
wherein the moisture adsorbent comprises at least one or more selected from the group consisting of $P_2O_5$, $Li_2O$, $Na_2O$, $BaO$, $CaO$, $MgO$, $Li_2SO_4$, $Na_2SO_4$, $CaSO_4$, $MgSO_4$, $CoSO_4$, $Ga_2(SO_4)_3$, $Ti(SO_4)_2$, $NiSO_4$, $CaCl_2$, $MgCl_2$, $SrCl_2$, $YCl_3$, $CuCl_2$, $CsF$, $TaF_5$, $NbF_5$, $LiBr$, $CaBr_2$, $CeBr_3$, $SeBr_4$, $VBr_3$, $MgBr_2$, $BaI_2$, $MgI_2$, $Ba(ClO_4)_2$ and $Mg(ClO_4)$.

16. The device of claim 1,
wherein the photocurable pressure-sensitive adhesive composition further comprises a filler.

17. The device of claim 16,
wherein the filler comprises at least one or more selected from the group consisting of clay, talc, silica, barium sulfate, aluminum hydroxide, calcium carbonate, magnesium carbonate, zeolite, zirconia, titania and montmorillonite.

18. The device of claim 1, further comprising:
a protective layer encapsulating the organic light emitting element and being between the cured pressure-sensitive adhesive film and the organic light emitting element.

19. A photocurable pressure-sensitive adhesive composition for encapsulating an organic electronic device of claim 1, comprising:
an acrylic polymer, an epoxy resin in an amount of 1 to 30 parts by weight relative to 100 parts by weight of the acrylic polymer and a cationic photopolymerization initiator.

20. A photocurable pressure-sensitive adhesive film for encapsulating an organic electronic device, which is a film-state product comprising the composition of claim 19, comprising:

a curable pressure-sensitive adhesive layer having a viscosity of $10^5$ to $10^7$ Pa·s before light irradiation and a viscosity of $10^6$ to $10^8$ Pa·s after light irradiation.

* * * * *